(12) United States Patent
Song

(10) Patent No.: US 12,381,283 B2
(45) Date of Patent: Aug. 5, 2025

(54) BATTERY CELL TRAY

(71) Applicant: LG ENERGY SOLUTION, LTD., Seoul (KR)

(72) Inventor: Hyeon Jin Song, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 2 days.

(21) Appl. No.: 17/917,441

(22) PCT Filed: Mar. 25, 2022

(86) PCT No.: PCT/KR2022/004181
§ 371 (c)(1),
(2) Date: Oct. 6, 2022

(87) PCT Pub. No.: WO2022/220437
PCT Pub. Date: Oct. 20, 2022

(65) Prior Publication Data
US 2025/0038342 A1   Jan. 30, 2025

(30) Foreign Application Priority Data
Apr. 15, 2021   (KR) .................. 10-2021-0049156

(51) Int. Cl.
*H01M 50/296*   (2021.01)
*H01M 10/48*   (2006.01)
(Continued)

(52) U.S. Cl.
CPC ....... *H01M 50/296* (2021.01); *H01M 10/486* (2013.01); *H01M 10/635* (2015.04); *H01M 50/209* (2021.01)

(58) Field of Classification Search
CPC ............ H01M 50/296; H01M 50/298; H01M 50/289; H01M 50/209; H01M 50/213;
(Continued)

(56) References Cited

U.S. PATENT DOCUMENTS

| 2004/0183541 A1 | 9/2004 | Hald et al. |
| 2011/0059342 A1 | 3/2011 | Lee et al. |

(Continued)

FOREIGN PATENT DOCUMENTS

| CN | 102804447 A | 11/2012 |
| CN | 105794015 A | 7/2016 |

(Continued)

OTHER PUBLICATIONS

Extended European Search Report for European Application No. 22772774.0, dated Oct. 12, 2023.

*Primary Examiner* — Raymond Alejandro
(74) *Attorney, Agent, or Firm* — Birch, Stewart, Kolasch & Birch, LLP

(57) ABSTRACT

A battery cell tray includes a lower tray which has an open upper portion, in which a plurality of battery cells are seated, and which has openings through which leads of both ends of the battery cell are exposed at both sides of the lower tray; an upper tray which has an open lower portion and which covers and is coupled to the lower tray; lead connectors installed on both sides of the upper tray and coupled to the leads of both ends of the battery cell; an electric wire connecting the lead connectors on both sides; and an instrument for measuring an electrical characteristic of the battery cell that is coupled to the electric wire.

19 Claims, 11 Drawing Sheets

(51) Int. Cl.
  *H01M 10/635*   (2014.01)
  *H01M 50/209*   (2021.01)

(58) Field of Classification Search
  CPC ............. H01M 10/635; H01M 10/647; H01M 10/486; H01M 10/482
  See application file for complete search history.

(56) References Cited

U.S. PATENT DOCUMENTS

| | | | |
|---|---|---|---|
| 2018/0212215 A1 | 7/2018 | Park et al. | |
| 2019/0051884 A1 | 2/2019 | Choi et al. | |
| 2020/0340863 A1 | 10/2020 | Lee et al. | |
| 2021/0226472 A1 | 7/2021 | Lee et al. | |
| 2021/0280950 A1* | 9/2021 | Dorresteyn | H01M 10/0404 |
| 2022/0085460 A1* | 3/2022 | Ellner | H01M 10/425 |
| 2022/0302521 A1* | 9/2022 | Harris | H01M 10/6556 |

FOREIGN PATENT DOCUMENTS

| | | |
|---|---|---|
| CN | 205385143 U | 7/2016 |
| CN | 107819092 A | 3/2018 |
| CN | 107923954 A | 4/2018 |
| EP | 2 538 466 A2 | 12/2012 |
| EP | 3 694 022 A2 | 8/2020 |
| JP | 2004-286730 A | 10/2004 |
| JP | 2013-145638 A | 7/2013 |
| JP | 2018-132440 A | 8/2018 |
| JP | 2018-133288 A | 8/2018 |
| KR | 10-1999-025354 A | 4/1999 |
| KR | 10-1127275 B1 | 4/2012 |
| KR | 10-1456425 B1 | 10/2014 |
| KR | 10-2017-0114852 A | 10/2017 |
| KR | 10-2018-0092029 A | 8/2018 |
| KR | 10-2019-0140785 A | 12/2019 |
| KR | 10-2020-0078207 A | 7/2020 |
| KR | 10-2164460 B1 | 10/2020 |

* cited by examiner

[FIG. 1]
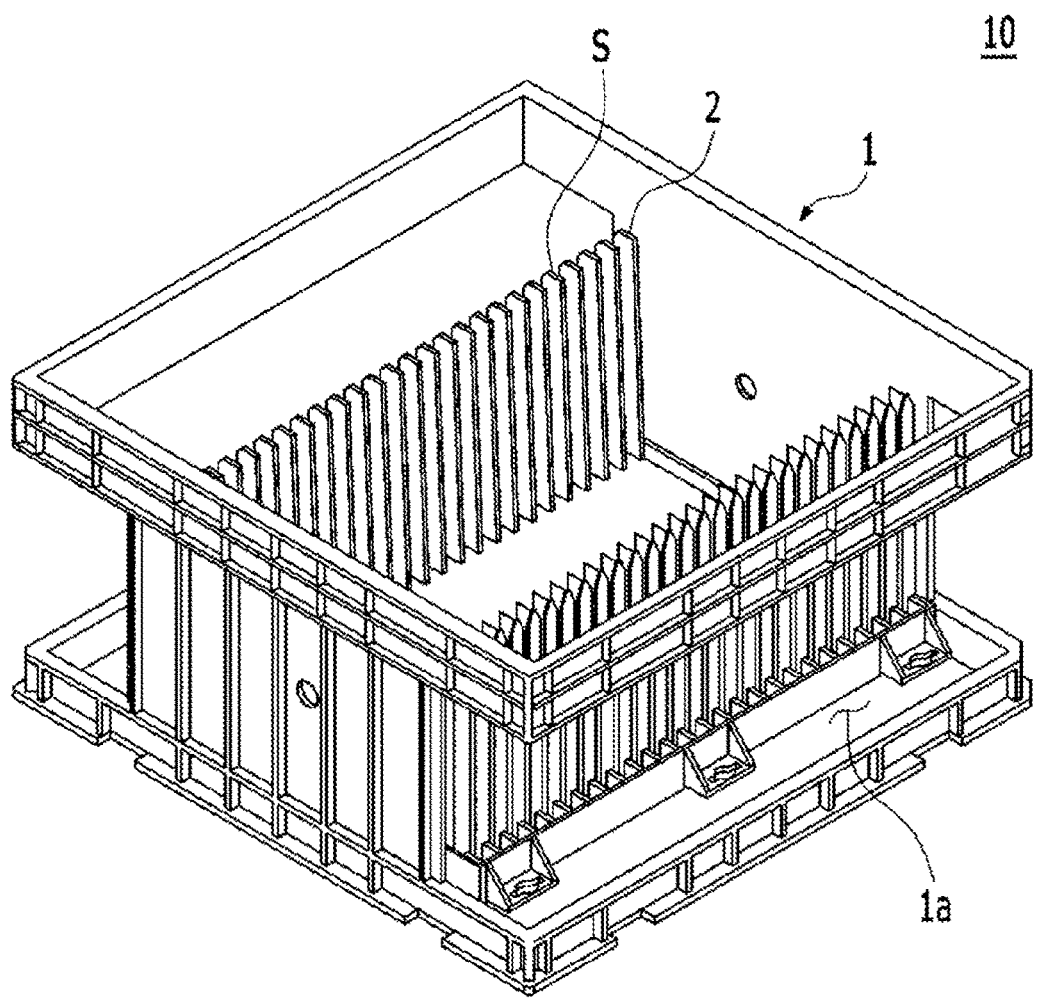
Conventional Art

[FIG. 2]
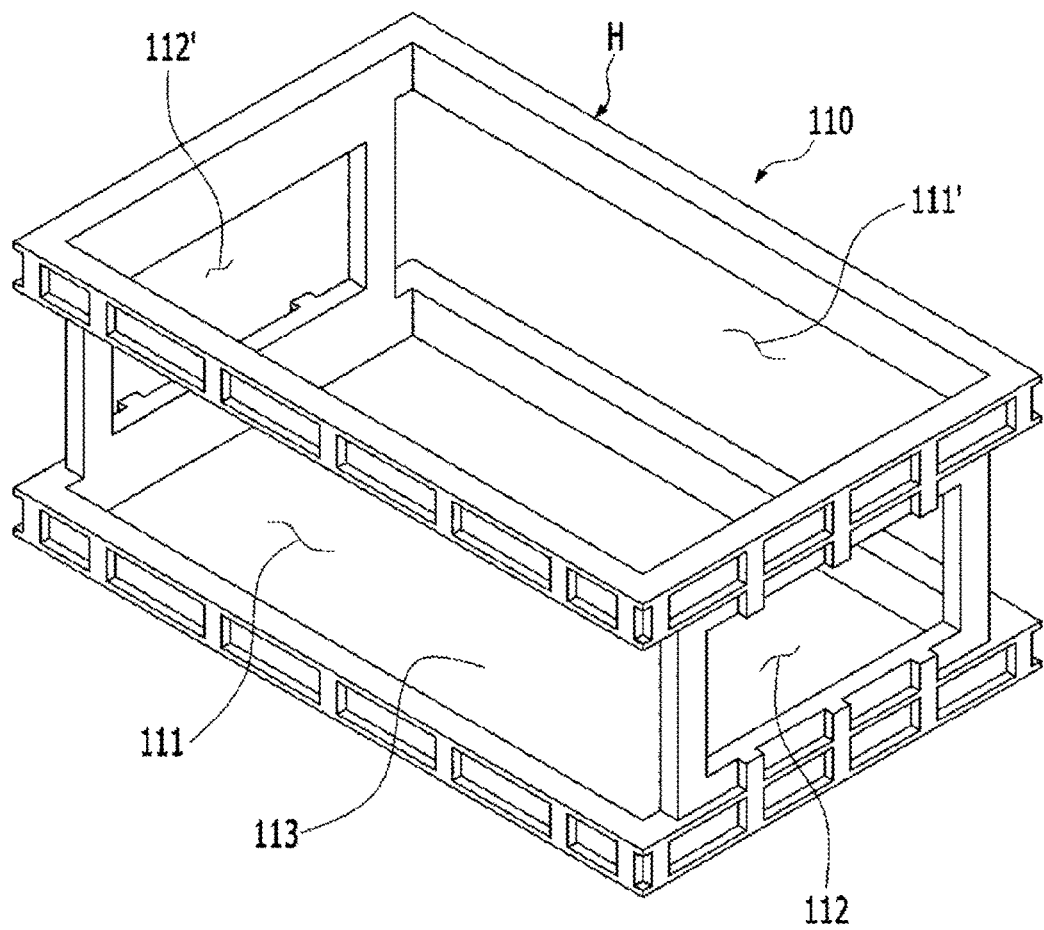

[FIG. 3]
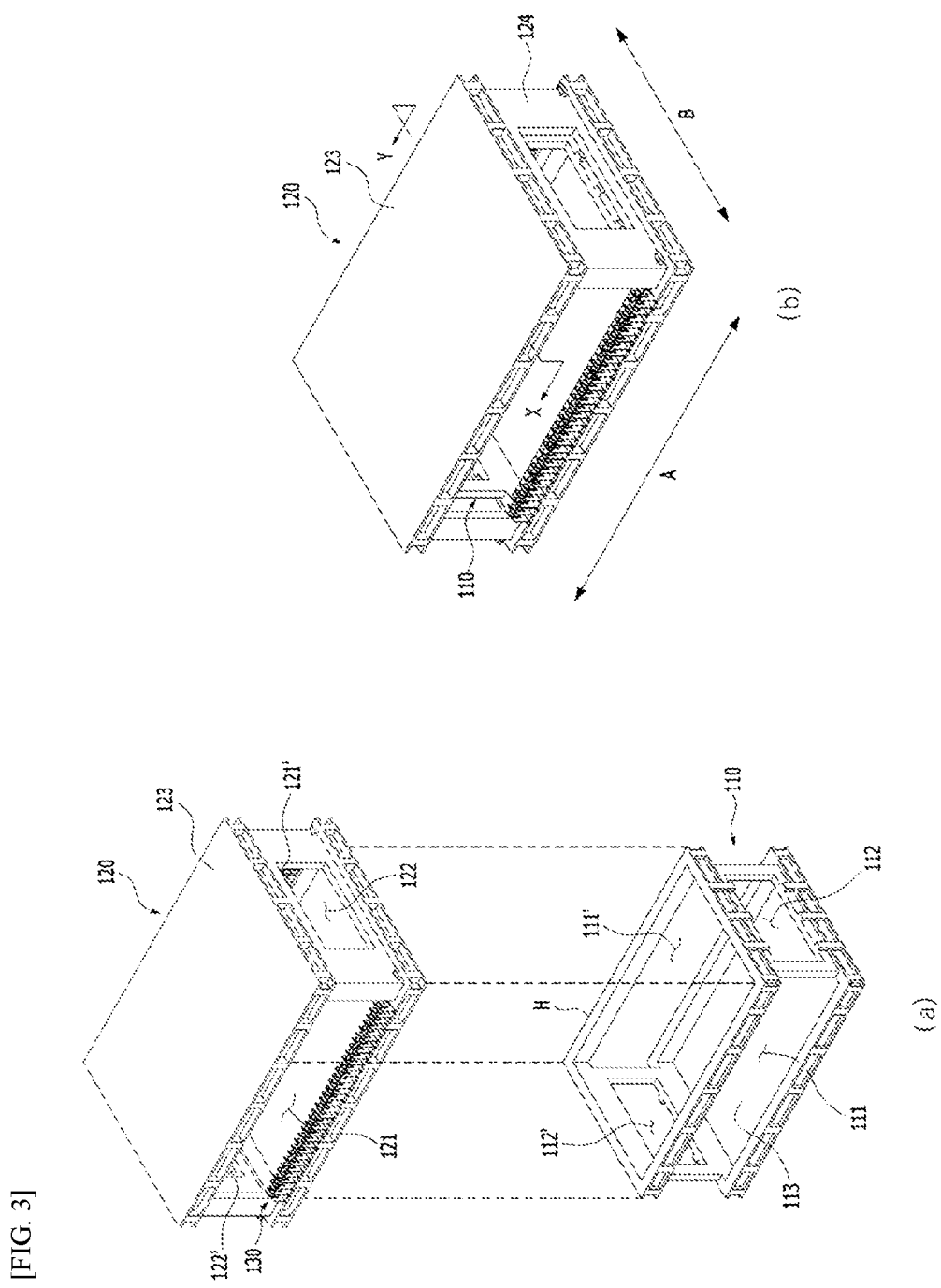

[FIG. 4]
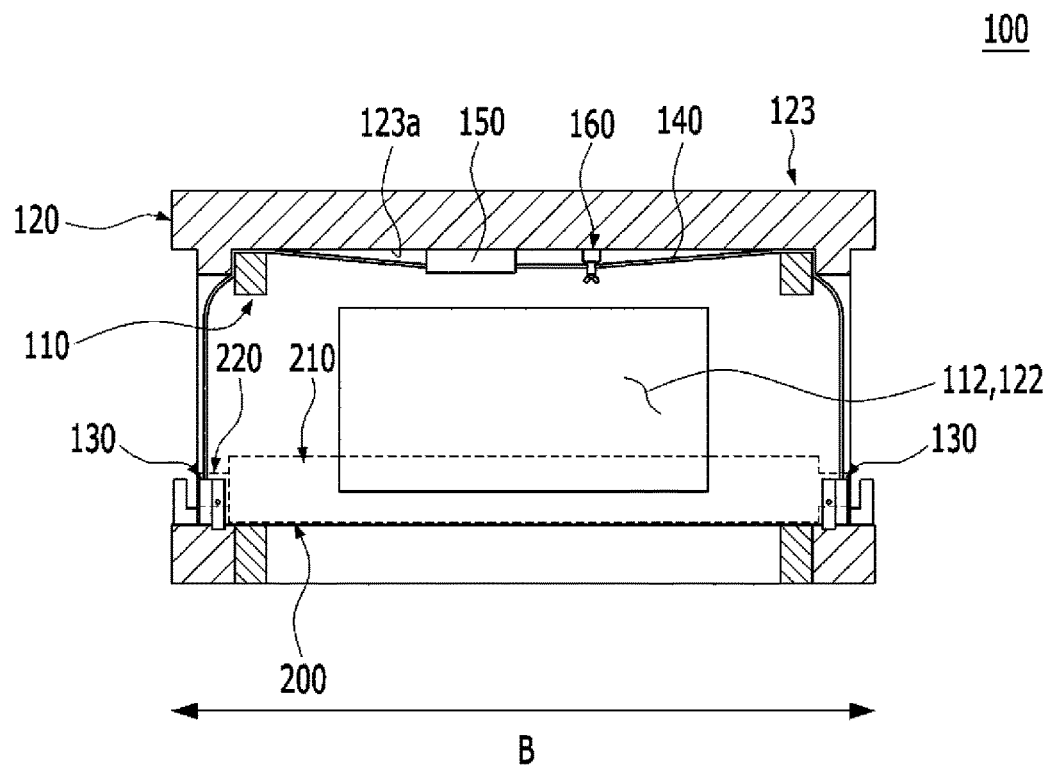

[FIG. 5]
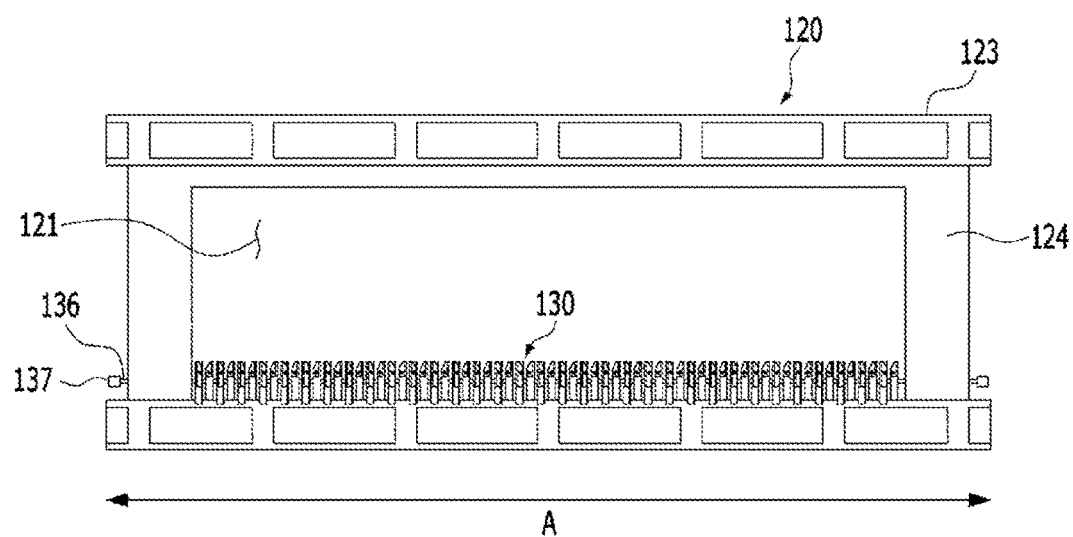

[FIG. 6]
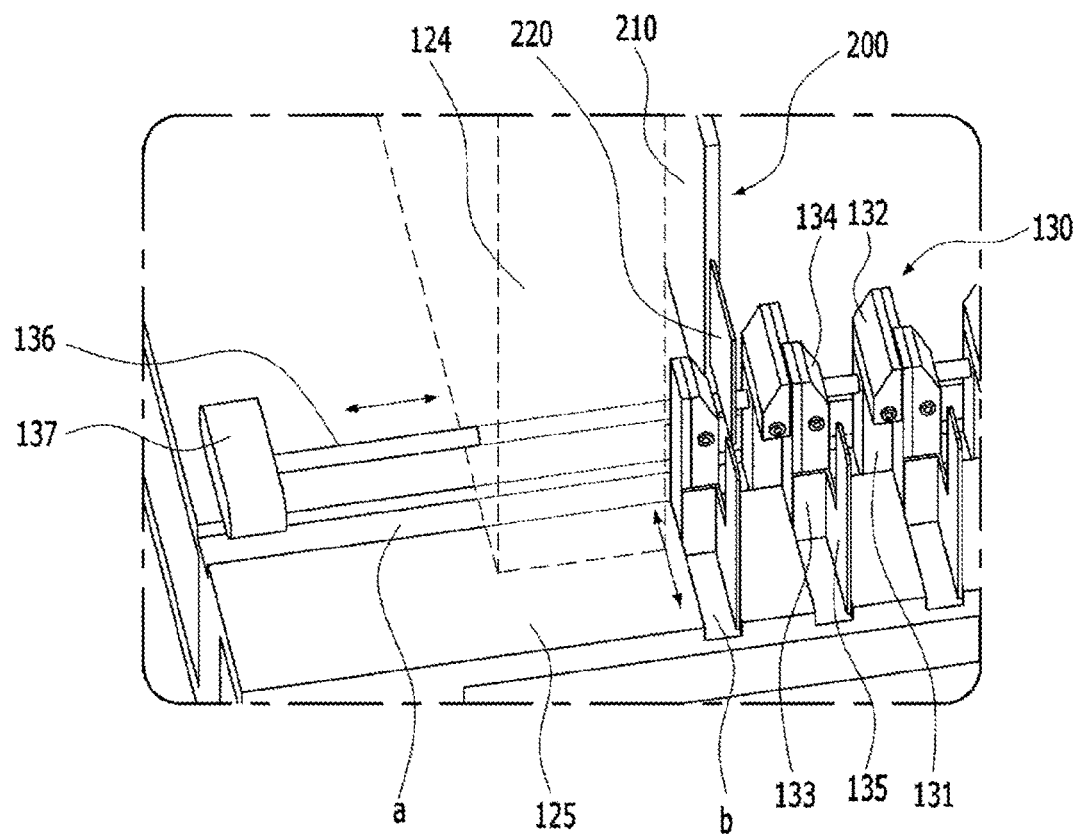

[FIG. 7]
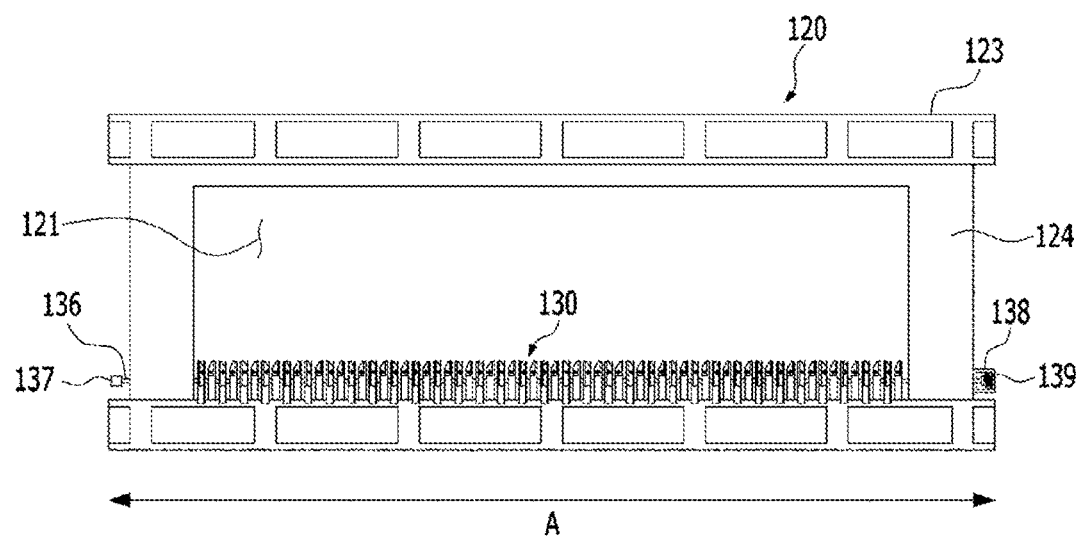

[FIG. 8]
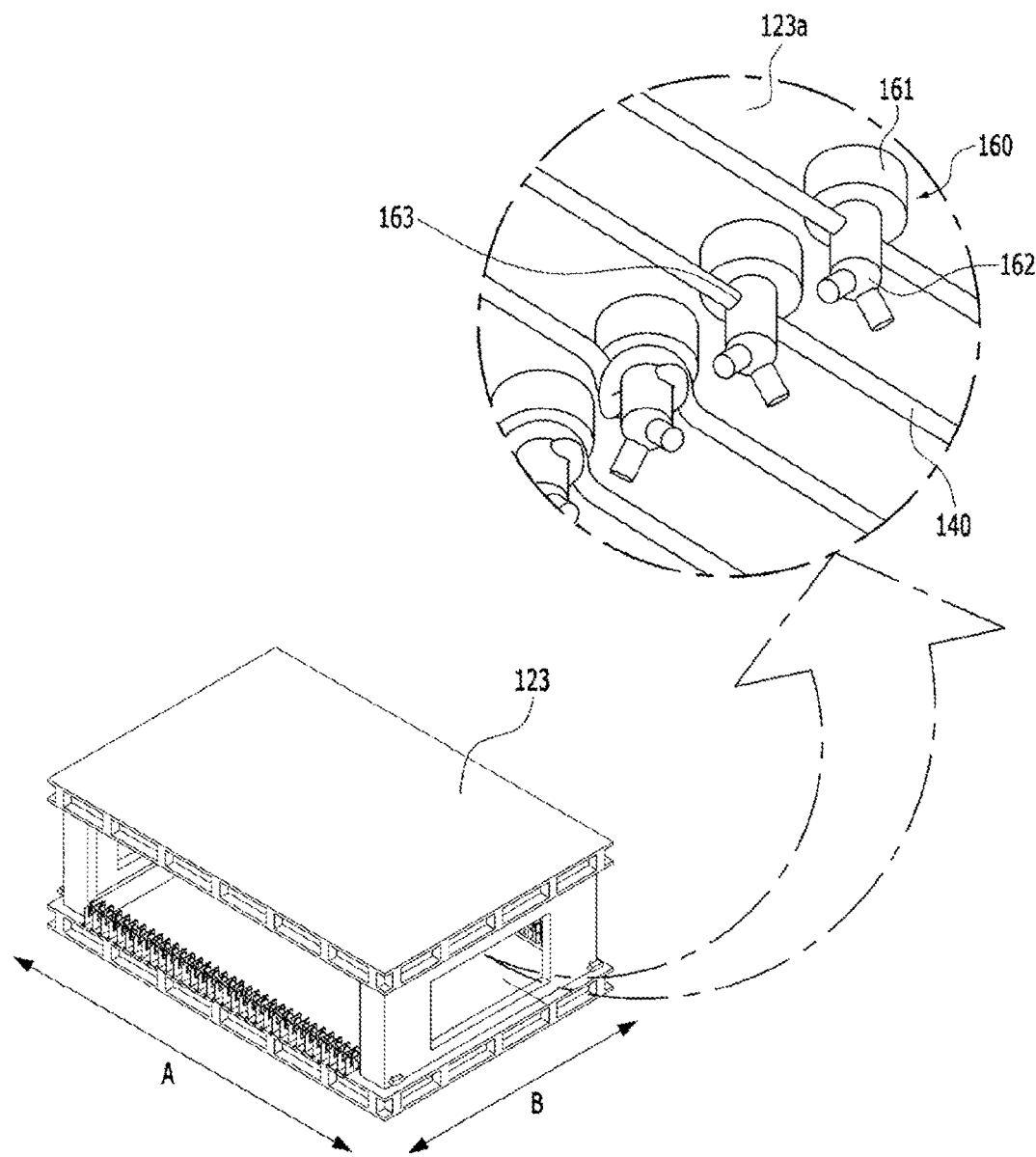

[FIG. 9]
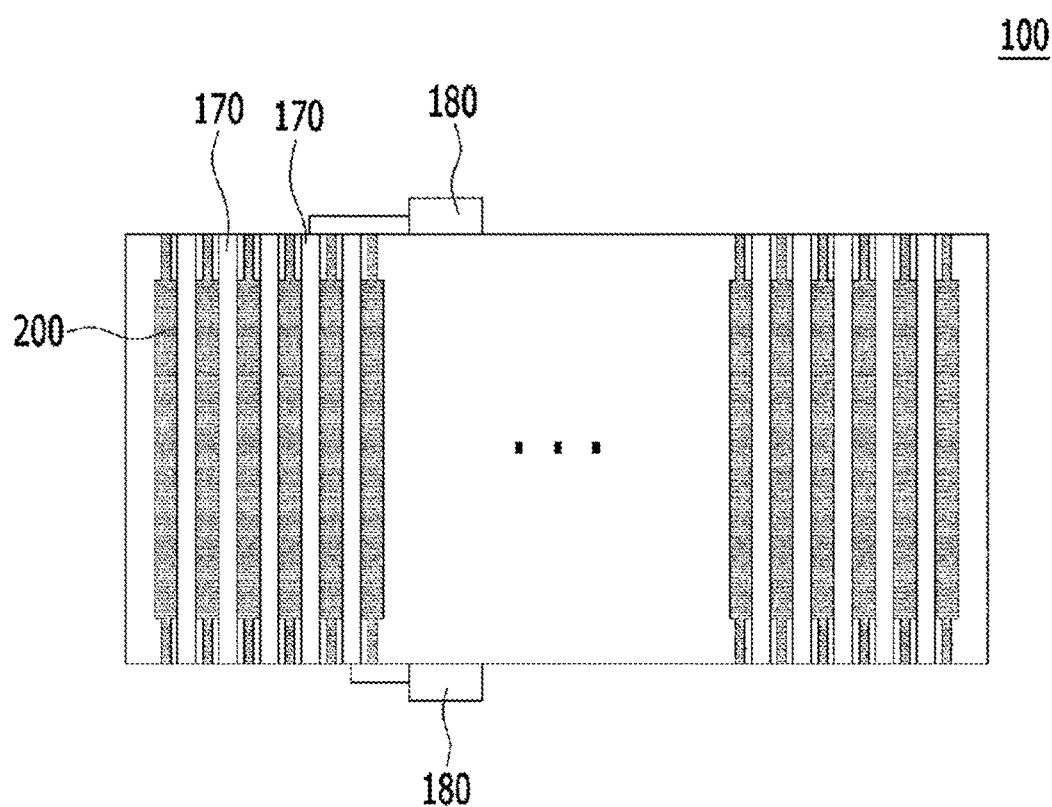

[FIG. 10]
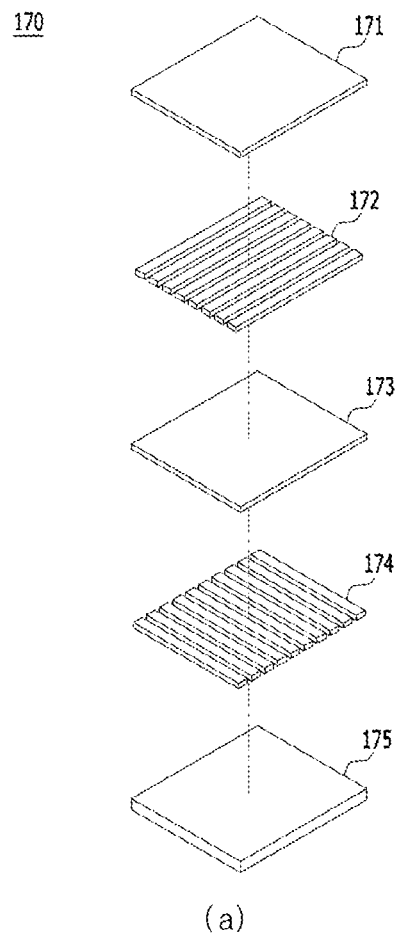
(a)
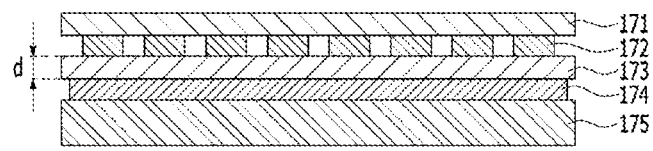
(b)

[FIG. 11]
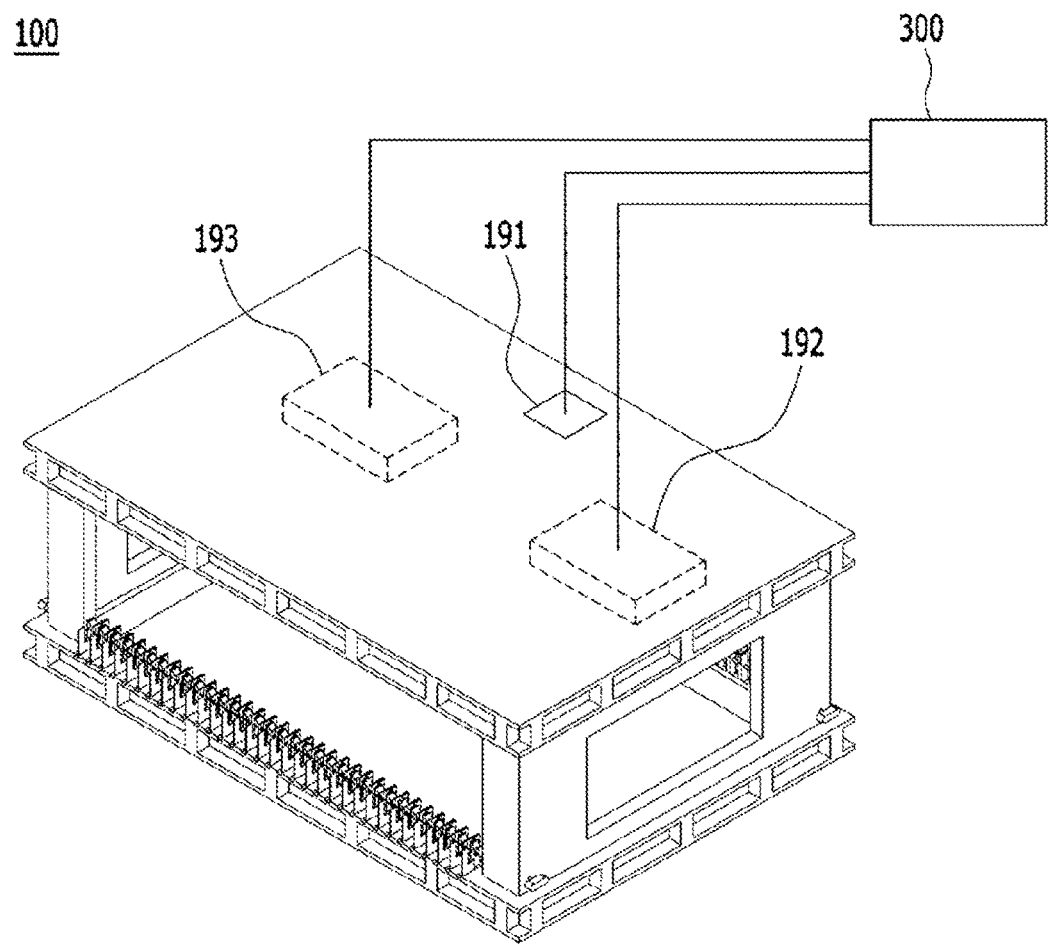

BATTERY CELL TRAY

TECHNICAL FIELD

The present invention relates to a battery cell tray, and more particularly, to a battery cell tray for accommodating or storing battery cells in a charging/discharging process for activation, an aging process, or transporting the battery cells between each process.

More specifically, the present invention relates to a battery cell tray capable of monitoring a state, such as electrical characteristics, of the battery cell even when the battery cell is stored or transported.

This application claims the benefit of priority based on Korean Patent Application No. 10-2021-0049156, filed on Apr. 15, 2021, and the entire contents of the Korean patent application are incorporated herein by reference.

BACKGROUND ART

As technology development and demand for mobiles, vehicles, and energy storage devices increase, the demand for batteries as energy sources is rapidly increasing, and among these secondary batteries, a lot of research has been made on lithium secondary batteries with a high energy density and a high discharge voltage and the lithium secondary batteries have been commercialized and widely used.

In particular, the lithium secondary battery has an operating voltage of 3.6V or higher, which is three times that of a nickel-cadmium battery or a nickel-hydrogen battery which is widely used as a power source for a portable electronic device, and is a rapidly expanding trend in terms of high energy density per unit weight.

Recently, the use of a pouch-type battery having a structure in which a stacked or stacked/folding-type electrode assembly is embedded in a pouch-type battery case is gradually increasing due to low manufacturing costs, a small weight, easy shape deformation, and the like.

The pouch-type battery cell undergoes an activation process after the battery assembly process so as to impart the characteristics of a battery cell. The activation process includes a process of manufacturing a primary battery cell having a structure in which an electrode assembly and an electrolyte are accommodated in a battery case, an initial charging/discharging process for the primary battery cell, an aging process for the primary battery cell, and an additional charging/discharging process or aging process according to need in addition to the initial charging/discharging process and the aging process. In the charging/discharging process, a plurality of battery cells are accommodated in a tray, and a lead of each battery cell is connected to a terminal (gripper) of a charging and discharging device to be charged/discharged. In addition, before and after the charging/discharging process, the battery cell is accommodated in the tray and is stored in a specific place (warehouse) for a predetermined period of time, which is referred to as the aging process. Alternatively, in order to move the plurality of battery cells between the processes or from one warehouse to another warehouse, the plurality of battery cells are accommodated in the tray and transported.

However, the existing tray merely achieves a function of accommodating or transporting battery cells, and thus it is not possible to monitor characteristics or states of the battery cells during each process or during movement between the processes. For example, in an initial charging/discharging process, a voltage of the battery cell during charging and discharging can be measured by connecting a terminal of the charging and discharging device to a lead of the battery cell accommodated in the tray, but the voltage of the battery cell during movement or storage between the processes cannot be measured. In addition, due to characteristics of the charging/discharging process, it is difficult to measure other electrical characteristics such as impedance and the like other than the voltage. Since the battery cell before and after the activation process or the aging process has not yet established its electrical characteristics and is in a state in which the electrical characteristics such as a voltage, impedance, and an electric current can vary over time, it is necessary to monitor variations in the electrical characteristics. In addition, during the activation process or the aging process, the pouch-type battery cell has a considerable volume change, and a swelling phenomenon due to gas generated inside the battery cell may also occur. Therefore, it is necessary to monitor the pressure of the battery cell during the processes or therebetween.

In addition, for example, a temperature of each tray accommodated in one warehouse during the aging process should be uniform so that each battery cell accommodated in the tray can be uniformly aged. However, in reality, even in trays accommodated in the same warehouse, there is a case in which the temperatures are different according to a change in a state of the battery cell accommodated in the tray. Therefore, it is necessary to monitor the temperature of each tray and to uniformly adjust the temperature.

As described above, the development of a technology capable of monitoring the electrical characteristics of the battery cell, the pressure, and the temperature of the tray during the charging/discharging process and the aging process or between each process is desired.

RELATED ART DOCUMENT

Patent Document (Patent Document) Korean Registered Patent No. 10-1127275

DISCLOSURE

Technical Problem

An object of the present invention is to provide a battery cell tray capable of measuring and monitoring the electrical characteristics of a battery cell during a charging/discharging process, movement between processes, and an aging process.

In addition, another object of the present invention is to provide a multifunctional battery cell tray capable of monitoring a pressure or a temperature of a battery cell during each process or between processes.

In addition, still another object of the present invention is to provide a multifunctional battery cell tray capable of adjusting a temperature of each tray when battery cells are stored.

Technical Solution

A battery cell tray according to the present invention in order to solve above problems includes: a plurality of battery cells stacked in a first direction, a lower tray which has an open upper portion, the plurality of battery cells seated in the lower tray, and which has first openings at opposite side through which leads of opposite ends of each of the plurality of battery cells are exposed at; an upper tray which has an open lower portion and which covers the lower tray and is coupled to the lower tray; lead connectors installed on sides of the upper tray and coupled to the leads of each of the plurality of battery cells; an electric wire connecting the lead connectors; and an instrument for measuring an electrical characteristic of each of the plurality of battery cells, the instrument for measuring an electrical characteristic coupled to the electric wire.

Specifically, the electrical characteristic may include at least one of a voltage, impedance, and an electric current of the battery cell.

As an example, the instrument for measuring an electrical characteristic may be mounted on an inner surface of an upper plate of the upper tray.

As an example, each of the lead connectors may include a first terminal block and a second terminal block which are respectively in contact with a front surface and a back surface of one of the leads of one of the plurality of battery cells, and the first terminal block may be movable relative to the second terminal block in the first direction.

As a specific example, the first terminal block and the second terminal block may be provided respectively in plurality to correspond to a number of the plurality of battery cells, and the plurality of first terminal blocks may be fixedly coupled to a movable shaft installed to pass through the upper tray in the first direction and may be moved relative to each of the plurality of second terminal blocks according to movement of the movable shaft.

As another example, the upper tray may be provided with first open windows facing the first openings of the lower tray, each of the lead connectors may include a first terminal block and a second terminal block which are respectively in contact with a front surface side and a back surface side of one of the leads of one of the plurality of battery cells and may be installed on a lower window frame of the first open windows, and the first terminal block may be movable relative to the second terminal block in the first direction.

As an example, a connection terminal block connectable to a charging and discharging device for charging and discharging during an activation process of the plurality of battery cells may be coupled to the first terminal block or the second terminal block.

Specifically, a first guide groove extending in the first direction may be disposed in the lower window frame of each first open window, and the first terminal block may be installed in the first guide groove and may be movable relative to the second terminal block along the first guide groove.

Also, a second guide groove extending in a longitudinal direction of the plurality of battery cells may be disposed in the lower window frame of each first open window adjacent to the first guide groove, and the second terminal block may be movable along the second guide groove.

As a more specific example, the first terminal block and the second terminal block may be provided respectively in plurality to correspond to a number of the plurality of battery cells, and the plurality of first terminal blocks may be fixedly coupled to a movable shaft installed to pass through a side plate of the upper tray in the first direction and may be moved relative to each of the plurality of second terminal blocks according to movement of the movable shaft.

As an example, both ends of the movable shaft may protrude to an outside of the upper tray, and a first terminal block adjusting handle may be installed at the both ends.

As another example, a first end of the movable shaft may protrude to an outside of the upper tray, a first terminal block adjusting handle may be installed at the first end, and a second end of the movable shaft may be inserted into an elastic member housing attached to one side of the upper tray and pressed by an elastic member accommodated in the housing.

As another example, a length adjusting member of the electric wire may be mounted on the inner surface of the upper plate of the upper tray.

As a specific example, second openings may be disposed in opposite ends of the lower tray perpendicular to the opposite sides in which the first openings of the lower tray are disposed, and second open windows facing the second openings may be disposed in opposite ends of the upper tray perpendicular to the first open windows of the upper tray.

As a more specific example, the length adjusting member may include a body mounted on the inner surface of the upper plate, and a rotating handle screwed with respect to the body and having a through-hole through which the electric wire passes. and a length of the electric wire may be adjustable by rotation of the rotating handle.

As another example of the present invention, a pressure pad may be between the plurality of battery cells, a pressure sensor may be embedded in the pressure pad for measuring a surface pressure or a pressure distribution on the surface of one of the plurality of battery cells.

As an example, the battery cell tray may include a temperature sensor installed in the upper tray or the lower tray and configured to detect a temperature in the battery cell tray, and a temperature adjusting member installed in the upper tray or the lower tray and configured to heat and cool the battery cell tray.

Advantageous Effects

According to the present invention, electrical characteristics such as a voltage, impedance, an electric current, and the like of a battery cell can be conveniently monitored during a charging/discharging process and an aging process or between processes.

In addition, there is an effect of being able to comprehensively monitor a state of the battery cell, such as a pressure and a temperature of the battery cell, and uniformly adjust a temperature of a tray in which the battery cell is stored.

BRIEF DESCRIPTION OF THE DRAWINGS

FIG. 1 is a perspective view illustrating an conventional battery cell tray.

FIG. 2 is a perspective view illustrating one embodiment of a lower tray which is a component of a battery cell tray of the present invention.

FIG. 3 is a diagram illustrating a state before and after the coupling of an upper tray and a lower tray which constitute the battery cell tray of the present invention.

FIG. 4 is a schematic diagram illustrating one embodiment of the battery cell tray of the present invention, which is a side cross-sectional view along line X-Y of FIG. 3B.

FIG. 5 is a diagram illustrating one embodiment of a lead connector of the battery cell tray of the present invention.

FIG. 6 is a partially enlarged perspective view illustrating an operation aspect of the lead connector of FIG. 5.

FIG. 7 is a diagram illustrating another embodiment of a lead connector of the battery cell tray of the present invention.

FIG. 8 is a diagram illustrating a configuration of a length adjusting member of an electric wire installed in the battery cell tray of the present invention.

FIG. 9 is a plan view illustrating an installation state of a pressure pad provided in the battery cell tray of the present invention.

FIG. 10 shows an exploded perspective view and a side cross-sectional view illustrating the pressure pad of FIG. 9.

FIG. 11 is a schematic diagram illustrating a temperature sensor and a temperature adjusting member which are provided in the battery cell tray of the present invention.

DETAILED DESCRIPTION OF THE PREFERRED EMBODIMENTS

Hereinafter, a detailed configuration of the present invention will be described in detail with reference to the accompanying drawings and various embodiments. The embodiments described below are illustratively shown to aid understanding of the present invention, the accompanying drawings are not drawn to scale to aid the understanding of the present invention, and dimensions of some components may be exaggerated.

The present invention may be modified in various ways and may have a variety of embodiments, and, therefore, specific embodiments will be illustrated in the drawings and a description thereof will be described in detail in the following description. The embodiments to be disclosed below, therefore, are not to be taken in a sense which limits the present invention to specific embodiments, and should be construed to include modifications, equivalents, or substitutes within the spirit and technical scope of the present invention.

FIG. 1 is a perspective view illustrating a conventional battery cell tray 10. The battery cell tray 10 is a battery cell tray for accommodating a non-cylindrical battery cell, for example, a pouch-type battery cell. As shown in the drawing, the battery cell tray 10 is provided with a box-shaped housing 1 having an open upper portion, and a plurality of insert plates 2 which are accommodated in the housing 1 and face each other. The insert plates 2 are disposed as a pair facing each other inside the housing 1 to allow both ends of a battery cell to be inserted. In addition, a slot S into which a lead of an end portion of the battery cell end is inserted is disposed between adjacent insert plates 2. An opening 1a is disposed in a side portion in which the insert plates 2 of the housing 1 are installed, and the lead of the battery cell may be exposed through the opening.

However, the existing battery cell tray 10 is merely capable of storing and transporting the battery cell, and there is no additional device capable of monitoring a state of the battery cell.

The present invention is an improvement of the conventional battery cell tray and is characterized in that, in order to measure and monitor a state of the battery cell, in particular, electrical characteristics, a lead connector coupled to leads of both ends of the battery cell, an electric wire connecting the lead connector, and an electrical characteristic measuring instrument coupled to the electric wire are provided in the battery cell tray. In addition, in order to provide a space for installing the lead connector and the electrical characteristic measuring instrument, the battery cell tray comprise two trays that are a lower tray, in which the battery cell is accommodated, and an upper tray covering and being coupled to the lower tray. That is, the battery cell tray of the present invention includes: a lower tray which has an open upper portion, in which a plurality of battery cells are seated, and which has a first opening through which leads of both ends of the battery cell are exposed at both sides of the lower tray; an upper tray which has an open lower portion and which covers the lower tray and is coupled to the lower tray; lead connectors installed on both sides of the upper tray and coupled to the leads of both ends of the battery cell; an electric wire connecting the lead connectors on both sides; and an electrical characteristic measuring instrument of the battery cell coupled to the electric wire.

FIG. 2 is a perspective view illustrating one embodiment of the lower tray 110 which is a component of the battery cell tray 100 of the present invention.

The lower tray 110 has a shape similar to that of the conventional battery cell tray. That is, the lower tray 110 is formed as a box-shaped housing H having an open upper portion. In addition, first openings 111 and 111' capable of exposing a lead of the battery cell are disposed in both sides of the housing H. A pair of a plurality of insert plates may be installed inside the housing H as shown in FIG. 1, but for convenience of description, the insert plates are not shown in FIG. 2. In addition, separate openings (second openings 112 and 112') may be disposed in both sides perpendicular to the first openings 111 and 111' of the lower tray 110. As described below, through the second openings 112 and 112', an operator can access and manipulate a length adjusting member of the electric wire connected to the lead connector. Alternatively, through the first openings 111 and 111', the operator can access and manipulate the length adjusting member. A plurality of battery cells, for example, about 26 to 32 battery cells, may be seated on a bottom plate 113 of the lower tray 110. The battery cell may be seated in the lower tray through the open upper portion of the lower tray 110.

FIG. 3 is a diagram illustrating a state before and after the coupling of an upper tray and a lower tray which constitute the battery cell tray of the present invention.

The lower tray 110 in FIG. 3 is the same as the lower tray shown in FIG. 2. In the present invention, in order to provide a space for installing the lead connector and the like, an upper tray 120 coupled to the lower tray 110 is provided. A lower portion of the upper tray 120 is open, and thus the lower tray 110 is coupled to the upper tray 120 through the open lower portion. The upper tray 120 may be provided with first open windows 121 and 121', through which the leads of the battery cell may be exposed, on both sides of the upper tray 120. When the upper tray 120 covers the lower tray 110 through a lower opening (see FIG. 3A) to be coupled to the lower tray 110 (see FIG. 3B), the first open windows 121 and 121' are located to face the first openings 111 and 111' on both sides of the lower tray. When the lower tray 110 is covered with the upper tray 120, the upper tray 120 hardly moves on the lower tray due to the load of the upper tray. In addition, when an outer circumference shape of the lower tray 110 is formed to fit an inner volume of the upper tray 120, the upper tray may be connected to the lower tray by covering the lower tray 110 with the upper tray 120. However, in order to strengthen the coupling between the lower tray 110 and the upper tray 120 in a state in which the lower tray 110 is covered with the upper tray 120, a separate fastening member (not shown) may couple the lower tray 110 to the upper tray 120.

Like the lower tray 110, separate second open windows 122 and 122' may be disposed on both sides of the upper tray 120, which are perpendicular to the first open windows 121 and 121'. The second open windows 122 and 122' are located to face the second openings 112 and 112' disposed in the lower tray. As described below, an operator may access and manipulate the length adjusting member of the electric wire connected to the lead connector through the secondopen windows. An upper plate 123 and a side plate 124 of the upper tray 120 provide a space for installing various members for measuring a state of the battery cell.

As shown in FIG. 3B, in this specification, a thickness direction of the battery cell, that is, a direction in which the battery cells are stacked in the tray, is indicated as a direction A. In addition, a longitudinal direction of the battery cell is indicated as a direction B.

FIG. 4 is a schematic diagram illustrating one embodiment of the battery cell tray of the present invention, which is a side cross-sectional view along line X-Y of FIG. 3B. In FIG. 3, the battery cell is omitted for convenience of description, whereas FIG. 4 shows a state in which a battery cell 200 is installed in the battery cell tray 100.

In FIG. 4, the upper tray 120 is installed to cover the lower tray 110, and the battery cell 200 is seated on the lower tray 110. In the battery cell 200, a battery cell case 210, which is a main body, is located in a central portion of the bottom plate 113 of the lower tray 110, and leads 220 at both ends are located, for example, between the insert plates (not shown), to be disposed and exposed through the first openings 111 and 111' of the lower tray 110 and the first open windows 121 and 121' of the upper tray 120. In addition, lead connectors 130 coupled to the leads 220 at both ends of the battery cell 200 are installed on both sides of the upper tray 120. The lead connector 130 serves as an electrical terminal coupled to the lead 220 of the battery cell 200. In this way, when the lead connectors 130 are installed on the battery cell tray, for example, both sides of the upper tray 120, even when various types of battery cells 200 are replaced and installed in the tray, various electrical characteristics of the battery cell may be easily measured by easily connecting the lead 220 of the battery cell 200 to the lead connector 130.

In addition, the battery cell tray 100 is provided with an electric wire 140 connecting the lead connectors 130 on both sides and an electrical characteristic measuring instrument 150 coupled to the electric wire 140. The electric wire 140 may be fixed to the upper plate 123 of the upper tray 120. Alternatively, the electrical characteristic measuring instrument 150 is mounted on an inner surface 123a of the upper plate so that the electric wire 140 may be indirectly fixed to the upper plate 123.

In this specification, the electrical characteristics of the battery cell 200 may be characteristics of the battery cell that can be measured using various measuring instruments by receiving electrical signals including a voltage, impedance, and an electric current of the battery cell through a terminal (lead connector) and an electric wire. For example, the electrical characteristic measuring instrument 150 may be a measuring instrument for measuring at least one among a voltage, impedance, and an electric current of the battery cell 200. The lead connector 130, the electric wire 140, and the electrical characteristic measuring instrument 150 may be provided respectively in plurality and installed in the upper tray 120 to correspond to the number of the battery cells 200. Alternatively, the electrical characteristic measuring instrument 150 may be a common single electrical characteristic measuring instrument connected to the plurality of lead connectors 130 and the plurality of electric wires 140. In this case, a plurality of terminals coupled to the plurality of electric wires 140 may be embedded in the electrical characteristic measuring instrument 150.

The electrical characteristic measuring instrument 150 may be mounted on the inner surface 123a of the upper plate of the upper tray 120 covering the lower tray 110. In this case, when an observation window is disposed in a portion of the upper plate 123 on which the electrical characteristic measuring instrument 150 is installed, a numerical value of the electrical characteristic displayed on the measuring instrument may be visually confirmed through the observation window. Alternatively, when at least a portion of the upper plate 123 of the upper tray 120 is made of a transparent material, a value of the electrical characteristic measuring instrument 150 may be confirmed even without the observation window provided in the upper plate. As another example, the electrical characteristic measuring instrument 150 may be wired or wirelessly connected to an external server or an external controller to transmit data related to the electrical characteristics measured by the electrical characteristic measuring instrument 150 to the external server or the external controller.

As a specific example, the lead connector 130 includes a first terminal block 132 and a second terminal block 134 which are respectively in contact with a front surface side and a back surface side of the lead 220 at both ends of the battery cell. The first and second terminal blocks 132 and 134 may each be made of an electrically conductive metal material, for example, copper. When the lead 220 at both ends of the battery cell is inserted between the two terminal blocks, the electrical characteristics of the battery cell 200 may be measured. One terminal block of the two terminal blocks may move relative to the other terminal block. When the terminal blocks are away from each other, the lead 220 of the battery cell may be located therebetween, and when one terminal block is in close contact with the other terminal block, the leads 220 at both ends of the battery cell is inserted therebetween to become an electrically conductive state. For example, the first terminal block 132 may be installed on both sides of the upper tray 120 to move relative to the second terminal block 134 in a thickness direction (a direction A) of the battery cell 200.

The first and second terminal blocks 132 and 134 may be provided respectively in plurality to correspond to the number of the battery cells 200. The terminal blocks may be installed on both sides of the upper tray 120, specifically, on the inner surface of the upper tray 120 facing the first openings 111 and 111' of the lower tray 110. Alternatively, as shown in FIGS. 5 and 7 which will be described below, when the first open windows 121 and 121' facing the first openings 111 and 111' of the lower tray 110 are disposed in the upper tray 120, the terminal blocks may be installed in window frame portions of the first open windows 121 and 121'. In order to stably support or install the terminal blocks, for example, when the terminal blocks are installed on both inner surfaces of the upper tray 120, a support plate (not shown) for supporting the terminal blocks may be installed on the inner surface. Alternatively, as shown in FIGS. 5 and 7, when the terminal blocks are installed in lower window frames 125 of the first open windows 121 and 121', an extension protruding forward is provided in the lower window frame 125 so that the terminal blocks may be stably installed on the extension.

In any case, when the first and second terminal blocks are installed on both sides of the upper tray 120, since it may be inconvenient to move the plurality of first terminal blocks 132 one by one, the plurality of first terminal blocks 132 are coupled to one movable shaft 136 and then the movable shaft 136 is moved so that the first terminal blocks 132 may be moved relative to the second terminal blocks 134. For example, when the movable shaft 136 is installed to extend to pass through the side plate 124 of the upper tray 120 in the thickness direction of the battery cell, and the first terminal blocks 132 are fixedly coupled to the movable shaft 136, the first terminal blocks 132 may be moved relative to the plurality of second terminal blocks 134 according to the movement of the movable shaft 136.

FIG. 5 is a diagram illustrating one embodiment of the lead connector 130 of the battery cell tray 100 of the present invention, and FIG. 6 is a partially enlarged perspective view illustrating an operation aspect of the lead connector 130 of FIG. 5.

The embodiment of FIG. 5 shows an example in which the first open windows 121 and 121' facing the first openings 111 and 111' of the lower tray 110 are disposed in the upper tray 120, and the lead connector 130 is installed in window frame portions of the first open windows 121 and 121'. For convenience of description, the battery cell 200 is omitted from FIG. 5.

As shown in FIG. 6, the plurality of first and second terminal blocks 132 and 134 are installed along the lower window frames 125 of the first open windows 121 and 121' of the upper tray 120 in the thickness direction of the battery cell 200. The lead connector 130 includes the first and second terminal blocks 132 and 134 which are respectively in contact with the front surface side and the back surface side of the lead 220 at both ends of the battery cell and are installed on the lower window frames 125 of the first open windows 121 and 121', and the first terminal blocks 132 are installed on the lower window frames 125 of the first open windows 121 and 121' to be moved relative to the second terminal blocks 134 in the thickness direction of the battery cell.

Referring to FIG. 6, the first terminal blocks 132 are disposed and installed in parallel on the lower window frames 125 in the thickness direction of the battery cell. Specifically, the first terminal blocks are coupled to first bracket blocks 131. In addition, the first terminal block 132 is laid down in a horizontal direction and is fixedly coupled to the first bracket block 131. Accordingly, the first terminal block 132 may move together with movement of the first bracket block 131. In addition, the first bracket block 131 is fixedly coupled to the movable shaft 136 extending in the thickness direction of the battery cell. In the present embodiment, the first terminal block 132 and the first bracket block 131 are disposed in a first guide groove a extending on the lower window frame 125 in the thickness direction of the battery cell.

Meanwhile, the second terminal blocks 134 are installed adjacent to the first terminal blocks 132 on the lower window frames 125 of the first open windows 121 and 121'. The second terminal blocks 134 are fixedly coupled to second bracket blocks 133 and move together with movement of the second bracket blocks 133. A second guide groove b extending in a direction perpendicular to the first guide groove a, that is, in the longitudinal direction of the battery cell, is disposed in the lower window frames 125 of the first open windows 121 and 121', and the second bracket block 133 is disposed in the second guide groove b.

As shown in FIG. 6, by moving a first terminal block adjusting handle 137 of the movable shaft 136 to the left and right in the thickness direction of the battery cell, the first bracket blocks 131 and the first terminal blocks 132 fixedly coupled thereto may be moved. That is, when the movable shaft 136 coupled to the first bracket block 131 fixedly coupled to the first terminal block is moved in a direction of a left-right arrow in FIG. 6, that is, in the thickness direction of the battery cell, since the plurality of first terminal blocks 132 may approach and move away from the second terminal blocks 134, it is possible to conveniently perform operations of inserting the leads of the battery cell between the first and second terminal blocks to make contact.

Meanwhile, since a length of the battery cell 200 or a length of the lead 220 is different according to the type of battery cell, the lead 220 may not be located between the first and second terminal blocks 132 and 134, or a sufficient contact area may not be secured. In order to be in electrical contact with the lead 220, when the first terminal block 132 is disposed horizontally long as shown in FIG. 6, the first terminal block 132 and the lead 220 may be reliably brought into contact by corresponding to a length or a protrusion length of the lead. Alternatively, the second terminal block 134 may also be disposed horizontally long in the same manner as the first terminal block 132. However, in the embodiment of FIG. 6, only the first terminal block 132 is horizontally disposed, and the second terminal block 134 is movable in the longitudinal direction of the battery cell to correspond to an extension direction of the first terminal block 132. That is, the second guide groove b extending in the longitudinal direction of the battery cell (a horizontal arrangement direction of the first terminal block) is disposed in the lower window frame 125 adjacent to the first guide groove a, and the second terminal block 134 (and the second bracket block 133) is installed in the second guide groove b so that the second terminal block 134 is allowed to be moved in the longitudinal direction of the battery cell. In this way, the second terminal block 134 is allowed to be moved in a front-rear direction corresponding to the length of the lead 220, that is, in the longitudinal direction of the battery cell so that electrical contact between the lead 220 and the first and second terminal blocks 132 and 134 is reliably maintained. However, due to the structure shown in FIG. 6, the movement of the second terminal block 134 is limited in the thickness direction of the battery cell.

A connection terminal block 135 connected to a charging and discharging device for charging and discharging during the activation process of the battery cell may be coupled to the second terminal block 134. Alternatively, it is also possible to couple the connection terminal block 135 to the first terminal block 132. In the embodiment of FIG. 6, the connection terminal block 135 is coupled to the second terminal block 134.

In the embodiment of FIGS. 5 and 6, the first open windows 121 and 121' facing the first openings 111 and 111' of the lower tray 110 are disposed in the upper tray 120, and the battery cell lead 220 to the lead connector 130 (the first and second terminal blocks) are exposed through the first openings and the first open windows. Accordingly, the lead connector 130 may be connected to the charging and discharging device (not shown) through the openings and the open windows. By connecting (a gripper of) the charging and discharging device to the lead connector 130, specifically, the connection terminal block 135 coupled to the second terminal block 134, without separately connecting the gripper of the charging and discharging device to the lead 220 of the battery cell, the charging/discharging process for activation may be performed in a state in which the battery cell 200 is accommodated in the battery cell tray 100. In this case, the electrical characteristics of the battery cell, for example, a voltage, impedance, and an electric current, during the charging/discharging process may be measured using the electrical characteristic measuring instrument 150 connected to the lead connector 130 by interposing the electric wire 140. As described above, according to the present invention, there is an advantage of being able to conveniently measure and monitor various electrical characteristics of the battery cell in a state in which the battery cell is accommodated in the battery cell tray without transferring the battery cell to a separate tray for charging and discharging or connecting the lead of the battery cell to the charging and discharging device.

Referring to FIG. 5 again, the first terminal block adjusting handle 137 is installed at both ends of the movable shaft 136 coupled to the first terminal blocks 132. Therefore, the movable shaft 136 and the first terminal blocks 132 may be freely moved in the thickness direction of the battery cell through any of the left and right sides of the side plate 124 of the upper tray 120 by pushing and pulling the handle as shown in FIG. 5.

FIG. 7 is a diagram illustrating another embodiment of the lead connector 130 of the battery cell tray 100 of the present invention. Unlike FIG. 5, in the embodiment of FIG. 7, the first terminal block adjusting handle 137 is installed only at one end of the movable shaft 136. That is, the first terminal block adjusting handle 137 is installed at one end of the movable shaft 136, which protrudes to the outside of the upper tray, and the other end of the movable shaft 136 is inserted into an elastic member housing 138 attached to one side of the upper tray 120. An elastic member 139 is accommodated in the housing 138, and the other end of the movable shaft 136 is always in a state of being pressed by the elastic member 139. Therefore, by pressing the movable shaft 136 from the left to the right (the thickness direction of the battery cell) against a pressing force of the elastic member 139, the first terminal blocks 132 are moved, and after the lead 220 of the battery cell is located between the first and second terminal blocks, the movable shaft 136 and the first terminal blocks 132 return to their original positions by a restoring force of the elastic member 139. In this case, due to the pressing force of the elastic member 139, there is an effect in that the first terminal blocks 132 is capable of reliably fitting and supporting the lead of the battery cell.

FIG. 8 is a diagram illustrating a configuration of a length adjusting member 160 of the electric wire 140 installed in the battery cell tray 100 of the present invention. As shown in FIG. 4, the electric wire 140 is installed in the upper tray 120 to connect the lead connectors 130 on both sides connected to the leads of both ends of the battery cell. It is necessary to adjust a length of the electric wire according to the length of the battery cell installed in the battery cell tray 100 or to tautly maintain the tension of the electric wire 140.

In this embodiment, as shown in FIG. 8, the length adjusting member 160 of the electric wire 140 is mounted on the inner surface 123a of the upper plate of the upper tray 120 covering the lower tray 110. In addition, in order to adjust or manipulate the length adjusting member 160, the second openings 112 and 112' are disposed on both sides of the lower tray, which are perpendicular to both sides in which the first openings 111 and 111' are disposed to expose the leads of both ends of the battery cell of the lower tray, so that the operator may access the second openings 112 and 112'. In addition, the second open windows 122 and 122' facing the second openings 112 and 112' are disposed on both sides of the upper tray perpendicular to the first open windows 121 and 121' of the upper tray 120 (see FIGS. 2, 3, and 8). Accordingly, the length adjusting member 160 is manipulated through the second open windows 122 and 122" and the second openings 112 and 112' so that the length and the tension of the electric wire 140 may be adjusted. Naturally, the manipulation and maintenance of the electrical characteristic measuring instrument 150 connected to the electric wire may also be performed through the second open windows and the second openings. When space permits, the manipulation of the length adjusting member and the maintenance of the electrical characteristic measuring instrument are also possible through the first openings 111 and 111' of the lower tray and the first open windows 121 and 121' of the upper tray.

Specifically, the length adjusting member 160 includes a body 161 mounted on the inner surface 123a of the upper plate, and a rotating handle 162 screwed with respect to the body 161 and having a through-hole 163 through which the electric wire 140 passes. In FIG. 8, some of the length adjusting members 160 show a state in which the length of the electric wire 140 is not adjusted, and the remaining show a state in which the rotating handle 162 is rotated and the electric wire is wound around the rotating handle so that the length of the electric wire 140 is adjusted. Since the rotating handle 162 is screw-coupled to the body 161 and tension applied to the electric wire is not strong, the rotating handle 162 does not return to its original state from the rotated state. More specifically, for example, the lead 220 of one end of the battery cell 200 is coupled to the lead connector 130 installed on one of both sides of the upper tray 120, the length adjusting member 160 is manipulated according to the length of the battery cell to adjust the length of the electric wire 140, and then the lead 220 of the other end portion of the battery cell 200 is connected the lead connector 130 installed on the other one of both sides of the upper tray 120 so that measurement by the above-described electrical characteristic measuring instrument 150 is possible.

Meanwhile, the length adjustment of the electric wire 140 is not limited to the above embodiment. For example, a length adjusting member may include a bobbin-type winding part for winding the electric wire and a fixing member for fixing the winding part so that the length adjusting member may be attached to the inner surface of the upper plate.

FIG. 9 is a plan view illustrating an installation state of a pressure pad 170 provided in the battery cell tray 100 of the present invention.

In the present embodiment, the pressure pad 170 for measuring a surface pressure or a pressure distribution of the battery cell 200 is installed in the lower tray 110. During the charging/discharging process, in the aging process or between processes, the pouch-type battery cell may have a swelling phenomenon in which the battery cell swells due to gas generated therein. Therefore, it is necessary to closely monitor the pressure of the battery cell during the activation process or between the detailed processes. To this end, in the present invention, the pressure pad 170 capable of measuring the pressure of the battery cell 200 may be installed between the battery cells 200 of the lower tray 110, and a pressure indicator 180 connected to the pressure pad 170 is installed in the battery cell tray 100. As shown in FIG. 9, the pressure indicator 180 may be installed in the upper tray 120 or the lower tray 110, as necessary. For example, the pressure indicator 180 may be installed on the side plate 124 or the upper plate 123 of the upper tray 120.

A pressure sensor is embedded in the pressure pad 170 to measure a surface pressure of the battery cell 200 or a pressure distribution on a surface of the battery cell. FIG. 10 shows an exploded perspective view and a side cross-sectional view illustrating one embodiment of the pressure pad 170 of FIG. 9. The pressure sensor of the present embodiment is a capacitive pressure sensor in which a dielectric is inserted between two parallel electrodes and an intersection of the two electrodes forms a capacitor and acts as a pressure sensing point. The pressure pad 170 includes a protective plate 171, a first electrode plate 172, a dielectric plate 173, a second electrode plate 174, and a substrate 175 from the top. The first electrode plate 172 is one of the two electrodes of the pressure sensor which detects a variation in capacitance. The second electrode plate 174 is the other one of the two electrodes of the pressure sensor which detects a variation in capacitance and is disposed to cross the first electrode plate 172. An elastic layer is disposed, as a dielectric plate 173, between the first and second electrode plates. The intersection of the first and second electrode plates 172 and 174 becomes a sensing point causing a variation in capacitance as the protective plate 171 is pressed. That is, when the pressure from the surface of the battery cell is transmitted to a specific position of the pressure pad 170 due to a variation in volume of the battery cell 200, the elastic layer is contracted at a sensing point corresponding to a pressing position so that a distance between the first and second electrode plates 172 and 174 is varied. According to the change in distance, a variation in capacitance corresponding to a formula of $C=\mu A/d$ (C denotes capacitance, u denotes a dielectric constant, A denotes an area, and d denotes the distance between the electrode plates) occurs at the corresponding sensing point. In this case, since the variation in capacitance occurs differently according to a magnitude of the applied pressure, it is possible to measure the surface pressure or the pressure distribution on the surface of the battery cell. Thereafter, when the applied pressure is removed, the first and second electrode plates return to their original positions due to a restoring force of the elastic layer.

According to the above embodiment, the present invention has an advantage in that, in addition to the electrical characteristics of the battery cell 200, the pressure or the variation in pressure on the surface of the battery cell may be continuously monitored during the activation process or between processes. Pressure values measured by the pressure pad 170 may be displayed on the pressure indicator 180 to be visually confirmed. Alternatively, pressure data may be transmitted to a server or a controller connected to the pressure indicator 180 in a wire or wireless manner. The pressure data may be data for adjusting process conditions such as temperature and time during the charging/discharging process or the aging process.

FIG. 11 is a schematic diagram illustrating a temperature sensor 191 and temperature adjusting members 192 and 193, which are provided in the battery cell tray 100 of the present invention. In the present embodiment, the temperature sensor and the temperature adjusting members are provided in the tray to monitor the temperature of the battery cell tray 100 and to adjust the temperature.

The temperature sensor 191 and the temperature adjusting members 192 and 193 may be installed in appropriate positions of the upper tray 120 or the lower tray 110. For example, as shown in FIG. 11, the temperature sensor and the temperature adjusting members may be installed on the inner surface 123a of the upper plate of the upper tray or the inner surface of the side plate 124. Naturally, when an installation space permits, the temperature sensor and the temperature adjusting members may also be installed on the inner surface of the lower tray. A temperature value measured by the temperature sensor 191 may be transmitted to an external temperature controller 300. In addition, on the basis of the temperature value, the temperature controller 300 may control the temperature adjusting members 192 and 193 to heat or cool the battery cell tray. To this end, the temperature sensor 191 and the temperature adjusting members 192 and 193 may be connected to the temperature controller 300 in a wire or wireless manner. It is also conceivable that that the temperature controller 300 is directly installed on the battery cell tray, but in consideration of an actual installation space of the battery cell tray, it is not easy to install the temperature controller. Therefore, for example, during the aging process in which several trays are stored in the warehouse and aged, the temperature sensor 191 and the temperature adjusting members 192 and 193 may be connected to the temperature controller 300 installed in the warehouse to adjust the temperature of the tray. Even when the battery cell trays are stored in the same warehouse, a temperature of each tray may be different according to a change in state of the battery cell accommodated in the battery cell tray. In this case, it is necessary to uniformly maintain an aging process condition between the trays by adjusting the temperature using the temperature adjusting members 192 and 193.

The temperature adjusting members 192 and 193 may be, for example, a positive temperature coefficient (PTC) heater element (a heating member 192) for heating the tray or a thermoelectric element (a cooling member 193), such as a Peltier element, for cooling the tray. The temperature adjusting member is a device generally used in the field of vehicle batteries, and thus a detailed description thereof will be omitted herein.

As described above, since the battery cell tray of the present invention includes members capable of measuring the electrical characteristics of the battery cell in the tray, for example, during the charging/discharging process for activating the battery cell, the aging process, or movement between processes, the voltage, the impedance, and the electric current of the battery cell are conveniently monitored so that there is an advantage that the voltage, the impedance, and the current can be used as basis data for adjusting each process condition.

In addition, as described above, the electrical characteristics of each battery cell are measured so that a defective battery cell can be detected.

In addition, according to the embodiments of the present invention, the position of the lead connector and the length of the electric wire connected thereto may be varied according to the length of the battery cell so that a battery cell tray capable of monitoring the electrical characteristics of the battery cell in response to the type of battery cell may be provided.

In addition, according to various embodiments of the present invention, in addition to the electrical characteristics, it is possible to monitor a state of the battery cell, such as a pressure and a temperature of the battery cell and it is possible to provide a multifunctional battery cell tray capable of adjusting, for example, the temperature of the tray during the aging process.

As described above, the present invention has been described in more detail with reference to the accompanying drawings and the embodiments. Therefore, since the configurations described herein or shown in the drawings are merely one embodiment of the present invention and do not represent all the technical spirit of the present invention, it should be understood that there may be various equivalents and modifications capable of substituting for the embodiments and the configurations at the time of filing the present application.

DESCRIPTION OF REFERENCE NUMERALS

100: battery cell tray
110: lower tray
111, 111': first openings
112, 112': second openings 113: bottom plate
H: housing
120: upper tray
121, 121': first open windows
122, 122': second open windows
123: upper plate
123a: inner surface of upper plate
124: side plate
125: lower window frame
A: thickness direction of battery cell
B: longitudinal direction of battery cell
130: lead connector
131: first bracket block
132: first terminal block
133: second bracket block
134: second terminal block
135: connection terminal block
136: movable shaft
137: first terminal block adjusting handle
a: first guide groove
b: second guide groove
138: elastic member housing
139: elastic member
140: electric wire
150: electrical characteristic measuring instrument
160: length adjusting member
161: body
162: rotating handle
163: through-hole
170: pressure pad
171: protective plate
172: first electrode plate
173: dielectric plate
174: second electrode plate
175: substrate
180: pressure indicator
191: temperature sensor
192: temperature adjusting member (heating member)
193: temperature adjusting member (cooling member)
200: battery cell
210: battery cell case
220: lead of battery cell
300: temperature controller

The invention claimed is:

1. A battery cell tray comprising:
a plurality of battery cells stacked in a first direction;
a lower tray which has an open upper portion, the plurality of battery cells seated in the lower tray, and which includes first openings at opposite sides, through which leads of opposite ends of each of the plurality of battery cells are exposed;
an upper tray which has an open lower portion and covers the lower tray and is coupled to the lower tray;
lead connectors installed on both sides of the upper tray and coupled to the leads of each of the plurality of battery cells;
an electric wire configured to connect the lead connectors; and
an instrument for measuring an electrical characteristic of each of the plurality of battery cells, the instrument for measuring an electrical characteristic coupled to the electric wire.

2. The battery cell tray of claim 1, wherein the electrical characteristic includes at least one of a voltage, impedance, and an electric current of the battery cell.

3. The battery cell tray of claim 1, wherein the instrument for measuring an electrical characteristic is mounted on an inner surface of an upper plate of the upper tray.

4. The battery cell tray of claim 1, wherein each of the lead connectors includes a first terminal block and a second terminal block which are respectively in contact with a front surface side and a back surface side of one of the leads of one of the plurality of battery cells, and
wherein the first terminal block is movable relative to the second terminal block in the first direction.

5. The battery cell tray of claim 4, wherein the first terminal block and the second terminal block are provided respectively in plurality to correspond to a number of the plurality of battery cells, and the plurality of first terminal blocks are fixedly coupled to a movable shaft installed to pass through the upper tray in the first direction and are moved relative to each of the plurality of second terminal blocks according to movement of the movable shaft.

6. The battery cell tray of claim 1, wherein:
the upper tray is provided with first open windows facing the first openings of the lower tray,
each of the lead connectors includes a first terminal block and a second terminal block which are respectively in contact with a front surface side and a back surface side of one of the leads of one of the plurality of battery cells and is installed on a lower window frame of the first open windows, and
the first terminal block is movable relative to the second terminal block in the first direction.

7. The battery cell tray of claim 6, wherein a connection terminal block connectable to a charging and discharging device for charging and discharging during an activation process of the plurality of battery cells is coupled to the first terminal block or the second terminal block.

8. The battery cell tray of claim 6, wherein a first guide groove extending in the first direction is disposed in the lower window frame of each first open window, and the first terminal block is installed in the first guide groove and is movable relative to the second terminal block along the first guide groove.

9. The battery cell tray of claim 8, wherein a second guide groove extending in a longitudinal direction of the plurality of battery cells is disposed in the lower window frame of each first open window adjacent to the first guide groove, and the second terminal block is movable along the second guide groove.

10. The battery cell tray of claim 8, wherein the first terminal block and the second terminal block are provided respectively in plurality to correspond to a number of the plurality of battery cells, and the plurality of first terminal blocks are fixedly coupled to a movable shaft installed to pass through a side plate of the upper tray in the first direction and are moved relative to each of the plurality of second terminal blocks according to movement of the movable shaft.

11. The battery cell tray of claim 10, wherein both ends of the movable shaft protrude to an outside of the upper tray, and a first terminal block adjusting handle is installed at the both ends.

12. The battery cell tray of claim 10, wherein a first end of the movable shaft protrudes to an outside of the upper tray, a first terminal block adjusting handle is installed at the first end, and a second end of the movable shaft is inserted into an elastic member housing attached to one side of the upper tray and pressed by an elastic member accommodated in the housing.

13. The battery cell tray of claim 1, wherein a length adjusting member of the electric wire is mounted on an inner surface of an upper plate of the upper tray.

14. The battery cell tray of claim 13, wherein second openings are disposed in opposite ends of the lower tray perpendicular to the opposite sides in which the first openings of the lower tray are disposed, and second open windows facing the second openings are disposed in opposite ends of the upper tray perpendicular to the first open windows of the upper tray.

15. The battery cell tray of claim 13, wherein the length adjusting member includes:
   a body mounted on the inner surface of the upper plate; and
   a rotating handle screwed with respect to the body and having a through-hole through which the electric wire passes, and
   wherein a length of the electric wire is adjustable by rotation of the rotating handle.

16. The battery cell tray of claim 1, further comprising a pressure pad between the plurality of battery cells, wherein pressure sensor is embedded in the pressure pad for measuring a surface pressure or a pressure distribution on the surface of one of the plurality of battery cells.

17. The battery cell tray of claim 16, further comprising a pressure indicator connected to the pressure pad is installed in the upper tray or the lower tray.

18. The battery cell tray of claim 1, further comprising:
   a temperature sensor installed in the upper tray or the lower tray and configured to detect a temperature in the battery cell tray; and
   a temperature adjusting member installed in the upper tray or the lower tray and configured to heat and cool the battery cell tray.

19. The battery cell tray of claim 18, wherein:
   the temperature sensor and the temperature adjusting member are connected to an external temperature controller; and
   the temperature adjusting member heats or cools the battery cell tray by the temperature controller on the basis of the temperature detected by the temperature sensor.

* * * * *